(12) United States Patent
Lee et al.

(10) Patent No.: US 9,894,764 B2
(45) Date of Patent: Feb. 13, 2018

(54) PRINTED CIRCUIT BOARD AND METHOD OF MANUFACTURING THE SAME

(71) Applicant: Samsung Electro-Mechanics Co., Ltd., Suwon-si (KR)

(72) Inventors: Sung-Uk Lee, Suwon-si (KR); Il-Jong Seo, Cheongju-si (KR); Jae-Hoon Choi, Yongin-si (KR); Yong-Ho Baek, Seoul (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/096,993

(22) Filed: Apr. 12, 2016

(65) Prior Publication Data

US 2016/0381796 A1 Dec. 29, 2016

(30) Foreign Application Priority Data

Jun. 26, 2015 (KR) .................. 10-2015-0091316

(51) Int. Cl.
*H05K 1/11* (2006.01)
*H05K 3/06* (2006.01)

(52) U.S. Cl.
CPC ............. *H05K 1/115* (2013.01); *H05K 3/067* (2013.01)

(58) Field of Classification Search
CPC ...... H05K 1/0271; H05K 1/11; H05K 1/0306; H05K 1/111; H05K 1/112; H05K 1/113; H05K 1/115; H05K 1/144; H05K 1/181; H05K 1/183; H05K 1/0284; H05K 3/04; H05K 3/06; H05K 3/022; H05K 3/18; H05K 3/067; H05K 3/244; H05K 3/282; H05K 3/4602; H05K 3/4647; H05K 3/4682; H05K 3/4697; H05K 2201/096; H05K 2201/0195; H05K 2201/0347; H05K 2201/0367; H05K 2201/09854; H05K 2201/10257; H05K 2203/0392; H05K 2203/0577; H05K 2203/0723; H01L 2224/16225; H01L 2224/48225; H01L 2225/1023; H01L 2225/1058; H01L 23/13; H01L 23/147; H01L 23/49811; H01L 23/49827; H01L 25/00; H01L 25/105; H01L 2924/15311; Y10T 29/49156
USPC ..................... 29/847; 174/258, 262; 361/746
See application file for complete search history.

(56) References Cited

U.S. PATENT DOCUMENTS

2015/0092356 A1* 4/2015 Yoshikawa ............. H01L 25/00
361/746
2016/0374197 A1* 12/2016 Lee ....................... H05K 1/0298

FOREIGN PATENT DOCUMENTS

KR 10-2009-0029508 A 3/2009

* cited by examiner

*Primary Examiner* — Timothy Thompson
*Assistant Examiner* — Guillermo Egoavil
(74) *Attorney, Agent, or Firm* — NSIP Law

(57) ABSTRACT

A printed circuit board and a method of manufacturing a printed circuit board are provided. The printed circuit board includes an insulating layer, a circuit layer embedded in the insulating layer, a solder resist layer disposed on one surface of the insulating layer, the solder resist layer having a cavity of a through-hole shape to expose a part of the circuit layer from the insulating layer, and a metal post embedded in the solder resist layer and exposed to outside via an opening of the solder resist layer, and the metal post includes a first post metal layer, a post barrier layer, and a second post metal layer disposed in that order.

16 Claims, 10 Drawing Sheets

PRINTED CIRCUIT BOARD AND METHOD OF MANUFACTURING THE SAME

CROSS REFERENCE TO RELATED APPLICATION

This application claims the benefit under 35 USC 119(a) of Korean Patent Application No. 10-2015-0091316 filed on Jun. 26, 2015, in the Korean Intellectual Property Office, the entire disclosure of which is incorporated herein by for all purposes.

BACKGROUND

1. Field

The following description relates to a printed circuit board and a method of manufacturing the same.

2. Description of Related Art

To meet the demand of producing lighter, thinner and smaller electronic devices having multifunctional capabilities, such as mobile phones, mobile terminals and other portable electronics, technologies for mounting electronic elements such as semiconductor chips, active elements or passive elements on multilayer boards have been developed. Further, various technologies for embedding components in circuit boards have been developed to achieve further minimization.

A printed circuit board may include a cavity in its insulating layer, and various elements or electronic components such as IC and semiconductor chips may be inserted or installed in the cavity. Also, a printed circuit board without using a core board may be prepared for thinner and smaller sizes. The printed circuit board without using a core board requires the use of a carrier board that functions as a support during the process for manufacturing the coreless printed circuit board.

Generally, a carrier board has a structure including a carrier insulating material in a completely hardened state, and a first metal plate and a second metal plate formed on the carrier insulating material. A method of manufacturing a printed circuit board using a carrier is disclosed in KR Patent Publication No 2009-0029508.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board includes an insulating layer, a circuit layer embedded in the insulating layer, a solder resist layer disposed on one surface of the insulating layer, the solder resist layer having a cavity of a through-hole shape to expose a part of the circuit layer from the insulating layer, and a metal post embedded in the solder resist layer and exposed to outside via an opening of the solder resist layer. The metal post includes a first post metal layer, a post barrier layer, and a second post metal layer disposed in that order.

The post barrier layer may be formed of a material that is different from that of the first post metal layer and the second post metal layer.

The post barrier layer may include a material that has a different reactivity to an etchant reactive to the first post metal layer and second post metal layer.

The circuit layer may have a 2-layered structure including a circuit metal layer and a circuit barrier layer, the circuit barrier layer disposed on the circuit metal layer.

A portion of the circuit layer that is exposed to the outside through the cavity may be formed in a single-layered structure including a circuit metal layer.

A thickness of the circuit layer exposed to outside through the cavity may be different from a thickness of the insulating layer, and a thickness of the circuit barrier layer may be substantially equal to a difference in the thickness of the circuit layer and the thickness of the insulating layer.

A first surface of the first post metal layer may have a smaller diameter than a second surface of the first post metal layer, and a first surface of the second post metal layer may have a smaller diameter than a second surface of the second post metal layer.

The solder resist layer may be disposed on the other side of the insulating layer to cover the circuit layer.

In another general aspect, a method of manufacturing a printed circuit board involves preparing a carrier board including a carrier inner layer, and an adhering layer, a first post metal layer, a post barrier layer, and a second post metal layer disposed on the carrier inner layer in that order; forming a circuit barrier layer on the second post metal layer; forming a build-up layer comprising an insulating layer and a circuit layer on the circuit barrier layer; eliminating the carrier inner layer and the adhering layer; forming a metal post by patterning the first post metal layer, the post barrier layer and the second post metal layer; and forming a solder resist layer on the insulating layer to cover a side surface of the metal post.

The preparing of the carrier board may involve forming the post barrier layer from a material that is different from that used for the first post metal layer and the second post metal layer.

The post barrier layer may be formed of a material that has a different reactivity to an etchant reactive to the first post metal layer and second post metal layer.

The forming of the circuit barrier layer may involve forming the circuit barrier layer from a material that is different from that used for the circuit layer and the second post metal layer.

The circuit barrier layer may be formed of a material that has a different reactivity to an etchant reactive to the circuit layer and the second post metal layer.

The forming of the metal post may involve forming an etching resist on the other surface of the first post metal layer to cover the upper part of the region to be included in the metal post; etching the first post metal layer exposed to the outside with a first etchant; etching the post barrier layer exposed to the outside by the etching of the first post metal layer with a second etchant; etching the second post metal layer exposed to the outside by the etching of the post barrier layer with the first etchant; and eliminating the etching resist, and the first post metal layer and the second post metal layer may not be reactive to the second etchant, and the post barrier layer may not be reactive to the first etchant.

The forming of the solder resist layer may involve forming a cavity with a through-hole shape in the solder resist layer.

The general aspect of the method may further involve eliminating the circuit barrier layer exposed to the outside through the cavity formed in the solder resist after forming the solder resist layer.

In another general aspect, a method of manufacturing a printed circuit board involves obtaining a carrier board comprising a first post metal layer, a post barrier layer, a second post metal layer and a carrier inner layer; forming a build-up layer on the carrier board, the build-up layer comprising an insulating layer and a circuit layer; removing a portion of the carrier board; forming a metal post by patterning the first post metal layer, the post barrier layer and the second post metal layer; and forming a solder resist layer on the insulating layer to cover a side surface of the metal post.

The forming of the metal post may involve etching the first post metal layer using a first etchant, and etching the post barrier layer using a second etchant different from the first etchant.

The removing of a portion of the carrier board may involve removing the carrier inner layer of the carrier board.

Other features and aspects will be apparent from the following detailed description, the drawings, and the claims

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
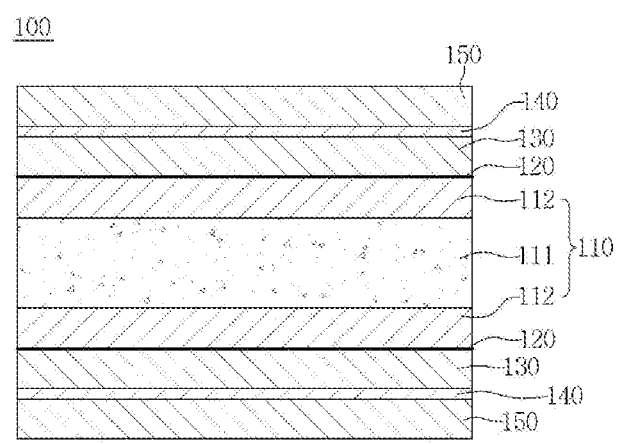
FIG. 1 is a cross-sectional view illustrating an example of a carrier board.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Unless otherwise defined, all terms, including technical terms and scientific terms, used herein have the same meaning as how they are generally understood by those of ordinary skill in the art to which the present disclosure pertains. Any term that is defined in a general dictionary shall be construed to have the same meaning in the context of the relevant art, and, unless otherwise defined explicitly, shall not be interpreted to have an idealistic or excessively formalistic meaning.

Identical or corresponding elements will be given the same reference numerals, regardless of the figure number, and any redundant description of the identical or corresponding elements will not be repeated. Throughout the description of the present disclosure, when describing a certain relevant conventional technology is determined to evade the point of the present disclosure, the pertinent detailed description will be omitted. Terms such as "first", "second", "one surface", "the other surface", "another surface", and the like can be used in describing various elements, but the above elements shall not be restricted to the above terms. The above terms are used only to distinguish one element from the other. In the accompanying drawings, some elements may be exaggerated, omitted or briefly illustrated, and the dimensions of the elements do not necessarily reflect the actual dimensions of these elements.

Hereinafter, certain embodiments of the present disclosure will be described in detail with reference to the accompanying drawings.

FIG. 1 illustrates an example of a carrier board.

Referring to FIG. 1, a carrier board 100 includes a carrier inner layer 110, an adhering layer 120, a first post metal layer 130, a post barrier layer 140, and a second post metal layer 150.

The carrier inner layer 110 includes a carrier insulating layer 111 and an inner metal layer 112.

The carrier insulating layer 111 may be formed of an insulating material. For example, the carrier insulating layer 111 may be formed of a thermosetting resin such as epoxy resin or a thermoplastic resin such as polyimide. In the alternative, the carrier insulating layer 111 may be formed of an insulating resin containing a reinforcing agent such as a glass or a metal such as a prepreg.

The inner metal layer 112 may be formed on at least one surface of the carrier insulating layer 111. Referring to FIG. 1, the carrier inner layer 110 includes both the carrier insulating layer 111 and the inner metal layers 112 formed on both surfaces of the carrier insulating layer 111.

The inner metal layers 112 may be formed of a conductive metal. For example, the inner metal layer 112 may be formed of copper.

In this example, the adhering layers 120 are provided on both surfaces of the carrier inner layer 110. For example, an adhering layer 120 is formed on one surface of the inner metal layer 112 that is formed on one surface of the carrier insulating layer 111. Another adhering layer 120 is formed on the other surface of the inner metal layer 112 that is formed on the other surface of the carrier insulating layer 111. The adhering layers 120 may provide adhesion between the carrier inner layers 110 and the first post metal layers 130. However, in another example, the adhering layer 120 may be provided on only one surface of the carrier inner layer 110. The adhering layers 120 may be formed of any adhesive agent that is known to be used in the circuit board field.

In this example, a first post metal layer 130 is formed on one surface of the adhering layer 120 formed on one surface of the carrier inner layer 110, and another first post metal layer 130 is formed on the other surface of the adhering layer 120 that is formed on the other surface of the carrier inner layer 110. However, in another example, the first post metal layer 130 may be formed on only one surface of the carrier inner layer 110.

Among known conductive metals used for circuits, the first post metal layer 130 may be formed of a metal that is different from the material used for the post barrier layer 140. For example, the first post metal layer 130 may be formed of a metal that does not react with an etchant reactive to the post barrier layer 140. For example, the first post metal layer 130 may be formed of copper (Cu).

In this example, a post barrier layer 140 is formed on one surface of the first post metal layer 130 that is formed on one surface of the adhering layer 120, and another post barrier layer 140 is formed on the other surface of the first post metal layer 130 that is formed on the other surface of the adhering layer 120. However, in another example, the post barrier layer 140 may be provided on only one surface of the carrier inner layer 110.

Among known conductive metals used for circuits, the post barrier layer 140 may be formed of a metal that is different from that used for the first post metal layer 130 and the second post metal layer 150. For example, the post barrier layer 140 may be formed of a metal that does not react with an etchant reactive to the first post metal layer 130 and the second post metal layer 150. In one example, the post barrier layer 140 is formed of nickel, while the first post metal layer 130 is formed of copper.

In this example, a second post metal layer 150 is formed on one surface of the post barrier layer 140 that is formed on one surface of the first post metal layer 130, and another second post metal layer 150 is formed on the other surface of the post barrier layer 140 that is formed on the other surface of the first post metal layer 130. However, in another example, the second post metal layer 150 may be provided on only one surface of the carrier inner layer 110.

The second post metal layer 150 may be formed of a metal that is different from the material used for the post barrier layer 140, among known conductive metals used for circuits. For example, the second post metal layer 150 may be formed of a metal that does not react with an etchant reactive to the post barrier layer 140. For example, the second post metal layer 150 may be formed of copper (Cu).

In an example of a printed circuit board obtained according to the present description, the first post metal layer 130, the post barrier layer 140 and the second post metal layer 150 in the carrier board 100 may serve as metal posts (not shown). During the manufacturing process, the first post metal layer 130, the post barrier layer 140 and the second post metal layer 150 in the carrier board 100 may be patterned in order through an etching process to form the metal posts in the printed circuit board. As the metal posts are formed through an etching process, a thickness difference between the metal posts may be reduced in comparison to metal posts formed through a plating process.

Figure 2:
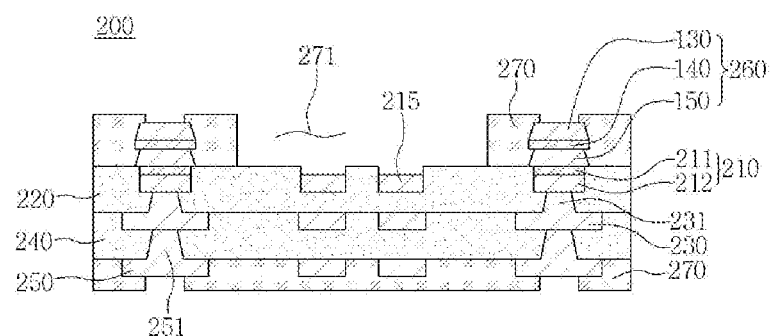
FIG. 2 is a cross-sectional view illustrating an example of a printed circuit board.

FIG. 2 illustrates an example of printed circuit board.

Referring to FIG. 2, a printed circuit board 200 includes an insulating layer, a circuit layer, a solder resist layer 270 and a metal post 260.

The insulating layer includes a first insulating layer 220 and a second insulating layer 240. The first insulating layer 220 may be formed on one surface of the second insulating layer 240.

The first insulating layer 220 and the second insulating layer 240 may be formed of a polymer composite resin that is used as an insulating material between layers. For example, the first insulating layer 220 may be formed of a prepreg, Ajinomoto build-up film (ABF), FR-4, bismaleimide triazine (BT), or an epoxy resin.

Referring to FIG. 2, the circuit layer includes a first circuit layer 210, a second circuit layer 230 and a third circuit layer 250.

In this example, the first circuit layer 210 is formed on one surface of the first insulating layer 220 and embedded into the first insulating layer 220. The first circuit layer 210 is formed in a 2-layered structure including a circuit metal layer 212 and a circuit barrier layer 211. That is, the circuit barrier layer 211 is formed on one surface of the circuit metal layer 212. However, the present description is not limited to the illustrated example.

The first circuit layer 210 includes a contact pad 215. The contact pad 215 is a part that is electrically connected with an electronic component (not shown) in the first circuit layer 210. The contact pad 215 may be formed in a single-layered structure of the circuit metal layer 212. The contact pad 215 may be thus formed to have a thickness that is equal to the thickness difference between the first insulating layer 220 and the circuit barrier layer 211.

The circuit metal layer 212 and the circuit barrier layer 211 may be formed of a conductive metal that is generally used in the circuit board field. However, the circuit metal layer 212 and the circuit barrier layer 211 may be formed of two different materials.

In one example, the circuit barrier layer 211 is formed of a first material that is different from a second material used to form the second post metal layer 150 and the circuit metal layer 212. For example, the second post metal layer 150 and the circuit metal layer 212 may be formed of a first material that is reactive to an etchant, and the circuit barrier layer 211 may be formed of a second material that is not reactive to the same etchant. In one example, the second post metal layer 150 and the circuit metal layer 212 are formed of copper, while the circuit barrier layer 211 is formed of nickel.

Referring to FIG. 2, the second circuit layer 230 is formed on the other surface of the first insulating layer 220, and embedded into the second insulating layer 240. The second circuit layer 230 may be electrically connected with the first circuit layer 210 through a first via 231 formed inside the first insulating layer 220.

The third circuit layer 250 is formed on the other surface of the second insulating layer 240 and protrudes toward an outside of the second insulating layer 240. The third circuit layer 250 may be electrically connected with the second circuit layer 230 through a second via 251 formed inside the second insulating layer 240.

The second circuit layer 230 and the third circuit layer 250 may be formed of a conductive metal that is generally used in the circuit board field. For example, the second circuit layer 230 and the third circuit layer 250 may be formed of copper.

The solder resist layer 270 is formed on one surface of the first insulating layer 220. The solder resist layer 270 formed on one surface of the first insulating layer 220 may be embedded into the metal post 260. In this example, the solder resist layer 270 may have a pattern with an opening that exposes a part of or entire one surface of the metal post 260. The upper surface of the metal post 260 that is exposed by the solder resist layer 270 may be electrically connected with an external component to be formed later.

Referring to FIG. 2, the solder resist layer 270 formed on one surface of the first insulating layer 220 includes a cavity 271 having a through-hole shape. The cavity 271 exposes one surface of the contact pad 215 of the first circuit layer 210 to the outside. The solder resist layer 270 may be formed so as to cover and protect the first circuit layer 210 from outside, except at the area where the cavity is provided to expose the contact pad 215.

Another solder resist layer 270 may be formed on the other surface of the second insulating layer 240 to cover and protect the third circuit layer 250. In this example, the second solder resist layer 270 may have an opening that exposes a part of the third circuit layer 250 that is electrically connected with an external component (not shown).

The solder resist layer 270 may prevent the third circuit layer 250 from being damaged due to soldering during the soldering process. The solder resist layer 270 may also prevent an oxidation of the third circuit layer 250.

The solder resist layer 270 may be formed of a heat resistant cladding material.

Referring to FIG. 2, the metal post 260 is formed on one surface of the first insulating layer 220, and embedded in the solder resist layer 270 provided on the first insulating layer 220. In this example, a part of the metal post 260 is exposed to the outside by an opening of the solder resist layer 270, and the other surface of the metal post 260 is electrically connected with the first circuit layer 210. However, in another example, the entire metal post 260 may be exposed to the outside from the solder resist layer 270.

In this example, the metal post 260 includes the first post metal layer 130, the second post metal layer 150 and the post barrier layer 140.

The post barrier layer 140 is formed on one surface of the second post metal layer 150, and the first post metal layer 130 is formed on one surface of the post barrier layer 140. Thus, one surface of the first post metal layer 130 is exposed to the outside via an opening in the solder resist layer 270, and the other surface of the second post metal layer 150 contacts the first circuit layer 210.

In this example, one surface of the first post metal layer 130 and the second post metal layer 150 have a smaller diameter than the other surface thereof. FIG. 2 illustrates that one surface of the first post metal layer 130, and the second post metal layer 150 has a smaller diameter than the other surface thereof. However, the structure of the first post metal layer 130 and the second post metal layer 150 may not be limited thereto. In another example not illustrated in FIG. 2, both surfaces of the first post metal layer 130 and the second post metal layer 150 may have the same diameter.

The post barrier layer 140 may be formed of a metal that is different from that used for the first post metal layer 130 and the second post metal layer 150. For example, the post barrier layer 140 may be formed of a material that does not react with an etchant reactive to the first post metal layer 130 and the second post metal layer 150. For example, the first post metal layer 130 and the second post metal layer 150 may be formed of copper, while the post barrier layer 140 may be formed of nickel.

Figure 3:
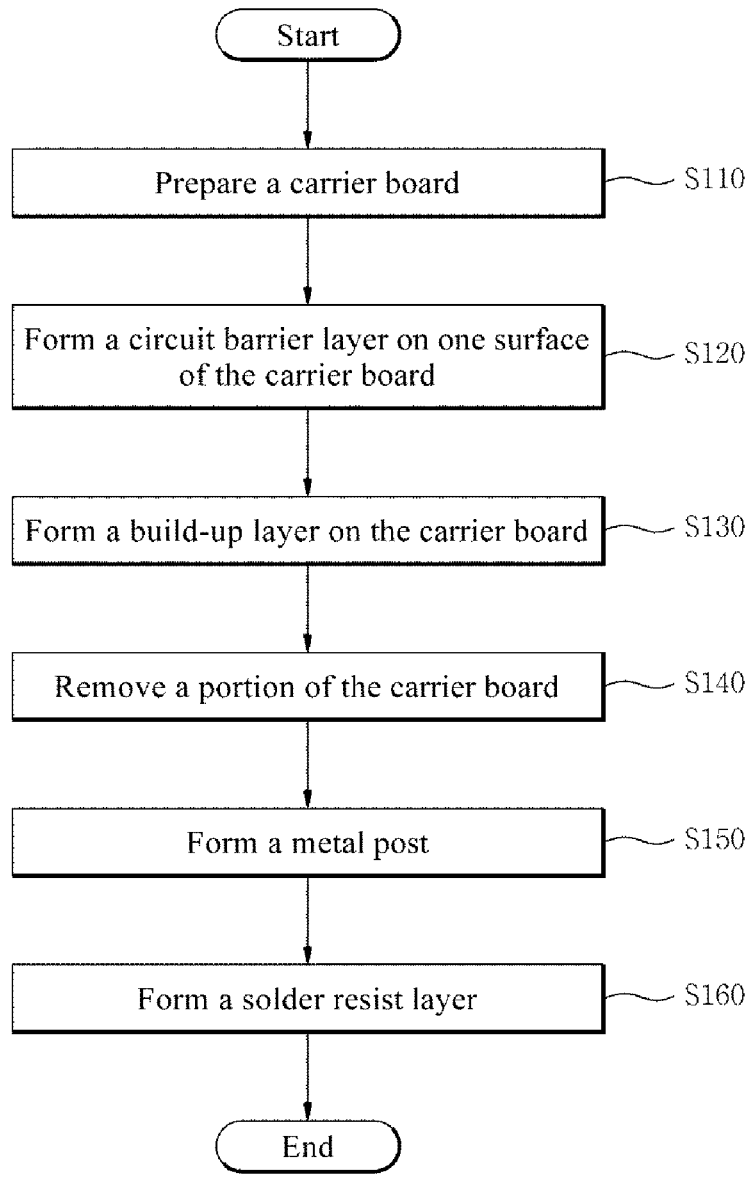
FIG. 3 is a flowchart illustrating an example of a method of manufacturing a printed circuit board.

FIG. 3 illustrates an example of a method of manufacturing a printed circuit board.

FIG. 4 to FIG. 19 are cross-sectional views illustrating a method of manufacturing a printed circuit board according to FIG. 3. Thus, the flowchart of FIG. 3 will be explained with reference to FIGS. 4 to 19.

Figure 4:
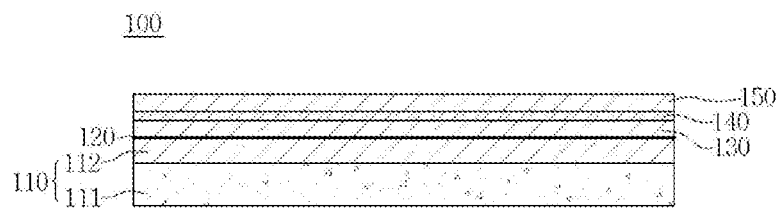
FIGS. 4 to 19 are cross-sectional views illustrating an example of a method of manufacturing a printed circuit board.

Referring to FIG. 4, a carrier board 100 is prepared, as in S110 of FIG. 3.

The carrier board 100 includes a carrier inner layer 110, an adhering layer 120, a first post metal layer 130, a post barrier layer 140 and a second post metal layer 150 formed in that order.

The carrier inner layer 110 includes a carrier insulating layer 111 and an inner metal layer 112 formed on one surface of the carrier insulating layer 111.

The carrier insulating layer 111 is formed of an insulating material. Examples for the insulating material include an epoxy resin, a polyimide, a prepreg and the like. The inner metal layer 112 may be formed of a conductive metal such as copper (Cu).

The adhering layer 120 is formed on one surface of the inner metal layer 112. The adhering layer 120 may be formed of an adhesive agent that is generally used in the circuit board field.

The first post metal layer 130 is formed on one surface of the adhering layer 120. The first post metal layer 130 may be formed of a material that is different from the material used for forming the post barrier layer 140. For example, the first post metal layer 130 may be formed of a metal that does not react with an etchant reactive to the post barrier layer 140. For example, the first post metal layer 130 may be formed of Cu.

The post barrier layer 140 is formed on one surface of the first post metal layer 130. The post barrier layer 140 may be formed of a metal. The metal may be selected from conductive metals generally used for forming circuits. The metal used for forming the post barrier layer 140 may be different from the metal used for forming the first post metal layer 130 and the second post metal layer 150. For example, the post barrier layer 140 may be formed of a metal that does not react with an etchant reactive to the first post metal layer 130 and the second post metal layer 150. An example of a metal that may be used for the post barrier layer 140 is nickel.

The second post metal layer 150 may be formed on one surface of the post barrier layer 140. The second post metal layer 150 may be formed of a material that is different from that used for the post barrier layer 140. For example, the second post metal layer 150 may be formed of a metal that does not react with an etchant reactive to the post barrier layer 140. For example, the second post metal layer 150 may be formed of Cu.

FIG. 4 illustrates the carrier board 100 that is composed of the carrier insulating layer 111, and the inner metal layer 112, the adhering layer 120, the first post metal layer 130, the post barrier layer 140 and the second post metal layer 150 which are formed on the carrier insulating layer 111. FIG. 4 only illustrates one surface of the carrier board 100 for convenience. However, in another example, the carrier board 100 may include the inner metal layer 112, the adhering layer 120, the first post metal layer 130, the post barrier layer 140 and the second post metal layer 150 formed on the other side of the carrier insulating layer 111. The method for manufacturing one surface of the carrier board 100 described above will be applied for that for manufacturing the other surface of the carrier board 100.

Figure 5:
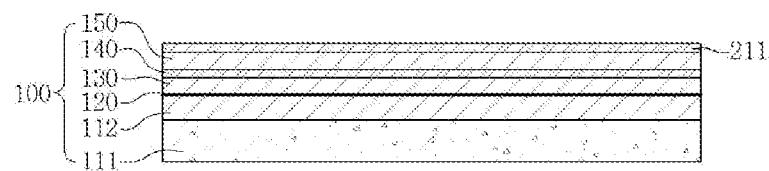

Referring to FIG. 5, a circuit barrier layer 211 is formed on one surface of the carrier board 100, as in S120 of FIG. 3.

The circuit barrier layer 211 may be formed on one surface of the second post metal layer 150 of the carrier board 100.

The circuit barrier layer 211 may be formed by a plating process. The circuit barrier layer 211 may be formed of a metal that is different from that used for the second post metal layer 150 of the carrier board 100. The circuit barrier layer 211 may be formed of a metal that does not react with the etchant which is reactive to the second post metal layer 150. For example, the circuit barrier layer 211 may be formed of nickel.

Referring to FIGS. 6 to 11, build-up layers are formed, as in S130 of FIG. 3.

Figure 6:
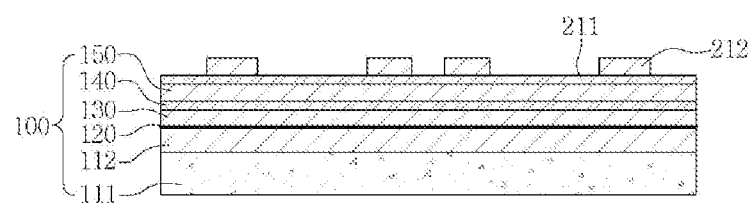

Referring to FIG. 6, a circuit metal layer 212 is formed on one surface of the circuit barrier layer 211.

The circuit metal layer 212 may be formed of a metal that is different from that used for the circuit barrier layer 211 among conductive metals for circuits. For example, the circuit metal layer 212 may be formed of a metal that does not react with the etchant reactive to the circuit barrier layer 211. For example, the circuit metal layer 212 may be formed of copper.

The circuit metal layer 212 may be formed by any method that is known to form a circuit layer in the circuit board field.

Figure 7:
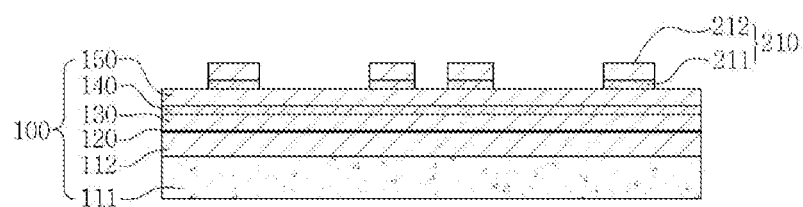

Referring to FIG. 7, the circuit barrier layer 211 that is exposed to the outside is eliminated.

The circuit barrier layer 211 that is exposed by the circuit metal layer 212 to the outside is eliminated. The circuit barrier layer 211 may be eliminated using a first etchant. The first etchant may react with the circuit barrier layer 211 but may not react with the circuit metal layer 212. Thus, the circuit metal layer 212 may not be eliminated.

When the circuit barrier layer 211 that is exposed to the outside is eliminated, the first circuit layer 210 including the circuit metal layer 212 and the circuit barrier layer 211 may be formed. The first circuit layer 210 may be formed in a 2-layered structure including the circuit metal layer 212 and the circuit barrier layer 211.

Figure 8:
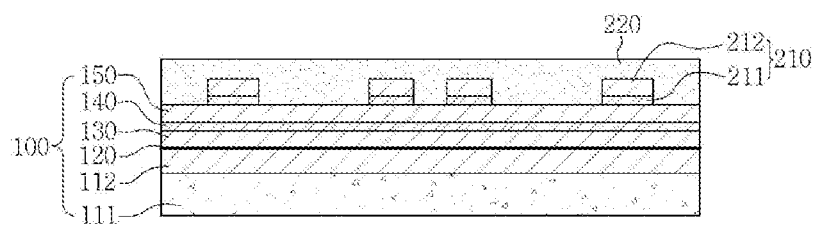

Referring to FIG. 8, a first insulating layer 220 may be formed on one surface of the carrier board 100.

The first insulating layer 220 may be formed on the one surface of the carrier board 100 and embed the first circuit layer 210.

The first insulating layer 220 may be formed of a polymer composite resin that is generally used as an insulating material between layers. For example, the first insulating layer 220 may be formed of a prepreg, Ajinomoto build-up film (ABF) and FR-4, bismaleimide triazine (BT), an epoxy resin and the like.

The first insulating layer 220 may be formed by laminating a board or a film on one surface of the carrier board 100.

However, the method and the material for forming the first insulating layer 220 may not be limited thereto. For example, the method and the material for forming the first insulating layer 220 may be any method and any material that are known in the circuit board field.

Figure 9:
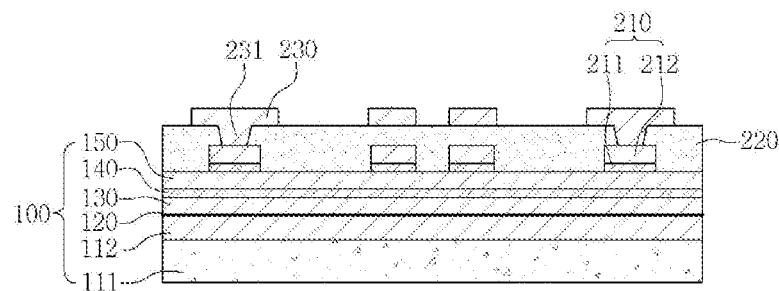

Referring to FIG. 9, a second circuit layer 230 is formed on one surface of the first insulating layer 220.

The second circuit layer 230 may be formed by any method that is known to form a circuit layer in the circuit board field. For example, the second circuit layer 230 may be formed by a tenting process, a semi-additive process or a modified semi-additive process.

The second circuit layer 230 may be formed of any conductive material that is known in the circuit board field. For example, the second circuit layer 230 may be formed of copper.

Referring to FIG. 9, a first via 231 is also formed when the second circuit layer 230 is formed. However, the present description is not limited thereto.

The first via 231 may be formed to electrically connect the first circuit layer 210 with the second circuit layer 230 by passing through the first insulating layer 220. For example, after forming a via hole (not shown) that passes through the first insulating layer 220, the first via 231 may be also formed at the same time when the second circuit layer 230 is formed. The first via 231 may be formed of a conductive metal which is known in the circuit board field.

Figure 10:
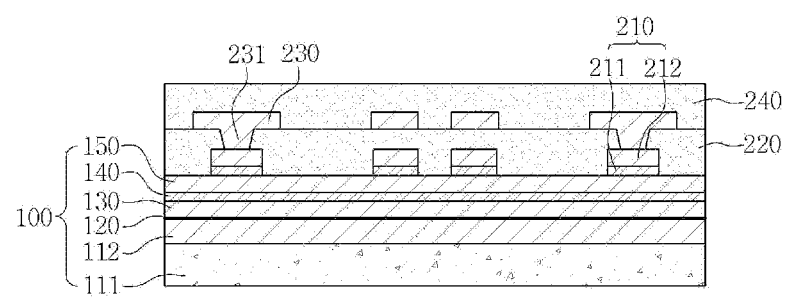

Referring to FIG. 10, a second insulating layer 240 is formed on one surface of the first insulating layer 220.

In this example, the second insulating layer 240 is formed on one surface of the first insulating layer 220 to embed the second circuit layer 230.

The second insulating layer 240 may be formed of a polymer composite resin that is used as an insulating material between layers. For example, the second insulating layer 240 may be formed of a prepreg, Ajinomoto build-up film (ABF) and FR-4, bismaleimide triazine (BT), an epoxy resin and the like.

The second insulating layer 240 may be formed by laminating a board or a film on one surface of the first insulating layer 220.

However, the method and the material for forming the second insulating layer 240 may not be limited thereto. In another example, the method and the material for forming the second insulating layer 240 may be modified to use any method and any material that are known in the circuit board field.

Figure 11:
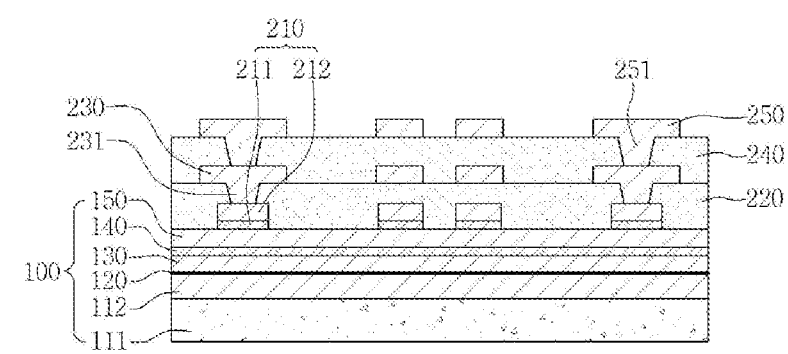

Referring to FIG. 11, a third circuit layer 250 is formed on one surface of the second insulating layer 240.

The third circuit layer 250 may be formed by any method that is known to form a circuit layer in the circuit board field. For example, the third circuit layer 250 may be formed by a tenting process, a semi-additive process or a modified semi-additive process.

The third circuit layer 250 may be formed of any conductive metal that is known in the circuit board field. For example, the third circuit layer 250 may be formed of copper.

When the third circuit layer 250 is formed, the second via 251 may be also formed. That is, in this example, the third circuit layer 250 is formed simultaneously with the second via 251. A second via 251 may be formed to electrically connect the second circuit layer 230 with the third circuit layer 250 by passing through the second insulating layer 240. For example, after forming a via hole that penetrates through the second insulating layer 240, the second via 251 may be also formed at the same time when the third circuit layer 250 is formed.

The second via 251 may be formed of a conductive metal that is known in the circuit board field.

As shown in FIGS. 6 to 11, build-up layers are formed on the third circuit layer 250. The build-up layers to the third circuit layer 250 include the first insulating layer 220, the second insulating layer 240, the first circuit layer 210.

According to one example, the build-up layers may include 2-layered insulating layers and 3-layered circuit layers. However, the structure of the build-up layer may not be limited thereto. The build-up layers may be formed to have as many layers as desirable by repeating or omitting the desired processes among FIGS. 6 to 11.

Figure 12:
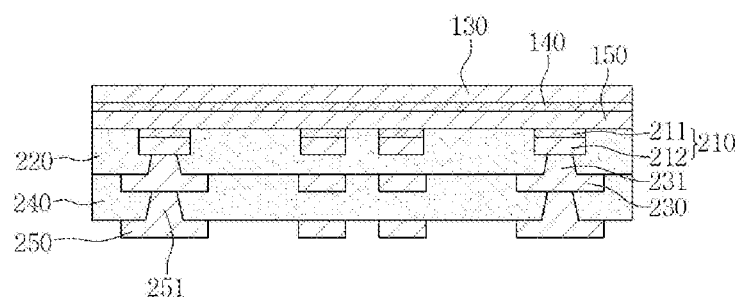

Referring to FIG. 12, a portion of the carrier board (100 in FIG. 11) is removed from the first post metal layer 130 and eliminated, as in S140 of FIG. 3.

According to the example illustrated in FIG. 12, the carrier inner layer (110 in FIG. 11) and the adhering layer (120 in FIG. 11) is separated and eliminated from the first post metal layer 130.

In FIG. 12, the separated build-up layers are illustrated in an upside-down state of FIG. 11.

The post barrier layer 140 is formed on one surface of the first post metal layer 130, and the other surface of the first post metal layer 130 is exposed to the outside. In this example, the manufacturing method is explained based on one surface and the other of the first post metal layer 13.

Referring to FIGS. 13 to 17, the metal post 260 is formed by patterning the first post metal layer 130, the post barrier layer 140 and the second post metal layer 150, as in S150 of FIG. 3.

Figure 13:
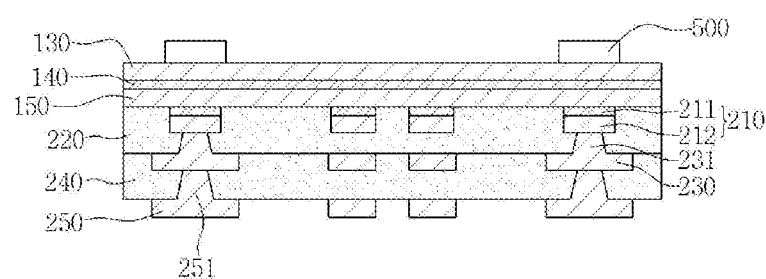

Referring to FIG. 13, an etching resist 500 is formed on one surface of the first post metal layer 130.

The etching resist 500 is formed on the region where the metal post (not shown) is to be formed later. Thus, the other region, except the region where the metal post (not shown) is to be formed later, is exposed to the outside by the etching resist 500.

The etching resist 500 may be formed in a dry film.

Figure 14:
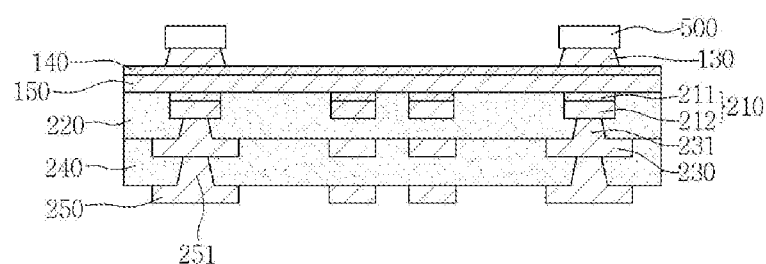

Referring to FIG. 14, the first post metal layer 130 is etched.

The first post metal layer 130 that is exposed to the outside by the etching resist 500 may be eliminated using a second etchant. The second etchant may react with the first post metal layer 130 but may not react with the post barrier layer 140. Thus, as shown in FIG. 14, the first post metal layer 130 that is exposed to the outside may be eliminated but not the post barrier layer 140.

One surface of the first post metal layer 130 has a smaller diameter than the other surface since when the second post metal layer 150 is eliminated with a liquid etchant, isotropic etching is performed. Such an isotropic etched structure is shown better as the thickness of the first post metal layer 130 increases. However, the structure of the first post metal layer 130 is not limited thereto even though the etching process is performed. That is, one surface and the other surface of the first post metal layer 130 may be the same with each other. The etching resist 500 is formed on one surface of the first post metal layer 130 and the post barrier layer 140 is formed on the other surface thereof.

Figure 15:
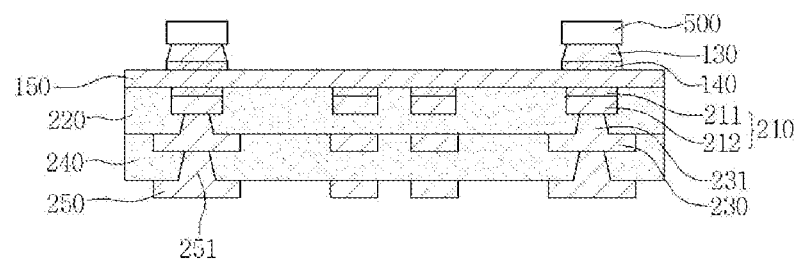

Referring to FIG. 15, the post barrier layer 140 is etched.

The post barrier layer 140, which is exposed by the etching resist 500 and the first post metal layer 130 using a third etchant, is eliminated from the surface of the second post metal layer 150. In this example, the third etchant reacts with the post barrier layer 140 but may not react with the first post metal layer 130 and the second post metal layer 150. Thus, as shown in FIG. 15, the post barrier layer 140 that is exposed to the outside may be only eliminated.

Since the post barrier layer 140 is formed thinner compared to the first post metal layer 130, the isotropic etched structure of the post barrier layer 140 is smaller than that of the first post metal layer 130.

Figure 16:
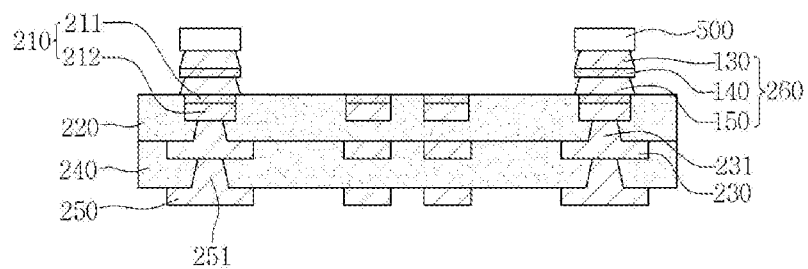

Referring to FIG. 16, the second post metal layer 150 is etched.

The second post metal layer 150 that is exposed outside the etching resist 500, the first post metal layer 130 and the circuit barrier layer 211 is eliminated by using a fourth etchant. The fourth etchant reacts with the second post metal layer 150, but not with the post barrier layer 140. Thus, as shown in FIG. 16, only the exposed portion of the second post metal layer 150 is eliminated.

The circuit barrier layer 211 is formed between the second post metal layer 150 and the first circuit layer 210. Thus, when the second post metal layer 150 is etched, the circuit barrier layer 211 prevents the first circuit layer 210 from being damaged by the fourth etchant.

One surface of the second post metal layer 150 has a smaller diameter than the other surface because, when the second post metal layer 150 is eliminated with a liquid etchant, isotropic etching is performed. Such an isotropic etched structure is shown better as the thickness of the second post metal layer 150 increases. However, the structure of the second post metal layer 150 is not limited thereto even though the etching process is performed. That is, one surface and the other surface of the second post metal layer 150 may be the same. The post barrier layer 140 is formed on one surface of the second post metal layer 150 and the first insulating layer 220 and the first circuit layer 210 are formed on the other surface thereof.

The first post metal layer 130 and the second post metal layer 150 may be formed of the same material. When the second post metal layer 150 is etched, the side surface of the first post metal layer 130 may be exposed by the fourth etchant. Thus, when the second post metal layer 150 is eliminated, the side surface of the first post metal layer 130 may be also etched so that the distance between one side surface and the other side surface may be decreased.

The first etchant to the fourth etchant may be used to etch the circuit barrier layer 211, the first post metal layer 130, the second post metal layer 150 and the post barrier layer 140. However, the first etchant to the fourth etchant may be the same or different. For example, the same etchant may be used to etch the circuit barrier layer 211 and the post barrier layer 140. The same etchant may be used to etch the first post metal layer 130 and the second post metal layer 150.

The metal post 260 may be formed by patterning in order the first post metal layer 130, the post barrier layer 140 and the second post metal layer 150.

More than one metal post 260 may be formed simultaneously. According to one example, because a plurality of metal posts 260 are formed through an etching process, the metal posts have more constant thickness, in comparison to metal posts formed through a plating process. More than one metal post 260 having a constant thickness may be provided due to decrease in the thickness difference.

It is shown and described that the metal post 260 has a structure to include the first post metal layer 130 and the second post metal layer 150 of which one surface has a smaller diameter than the other surface. However, the structure of the metal post 260 may not be limited thereto. Even though it is shown in FIG. 16, the metal post 260 may have a structure to include the first post metal layer 130 and the second post metal layer 150 of which one surface has the same diameter as the other surface.

Figure 17:
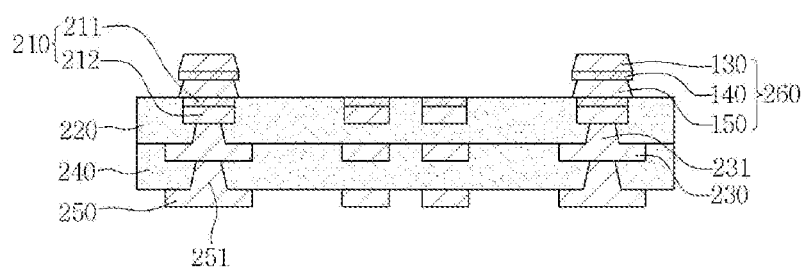

Referring to FIG. 17, the etching resist (500 in FIG. 16) is eliminated.

Figure 18:
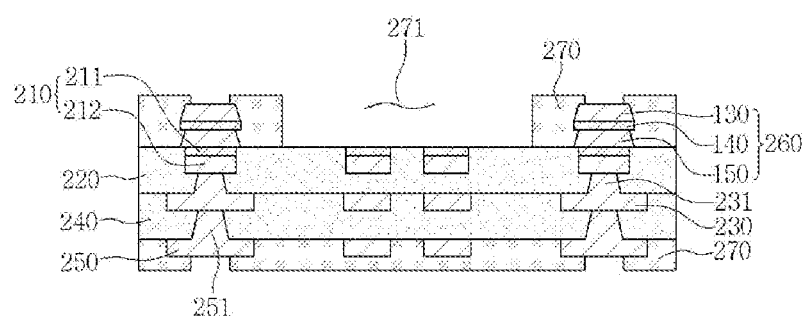

Referring to FIG. 18, the solder resist layer 270 is formed on one surface of the second insulating layer 240, as in S160 of FIG. 3.

The solder resist layer 270 is formed on one surface of the first insulating layer 220 to cover a side surface of the metal post 260. The solder resist layer 270 may be patterned to expose a part of the upper surface of the metal post 260. The upper surface of the metal post 260 that is exposed to the outside by the solder resist layer 270 may be electrically connected with an external component.

The solder resist layer 270 formed on one surface of the first insulating layer 220 includes a through-hole shaped cavity 271. The cavity 271 in the solder resist layer 270 exposes a part of the first insulating layer 220 and the first circuit layer 210 to the outside. In this example, the circuit barrier layer 211 of the first circuit layer 210 is exposed to the outside by the cavity 271 in the solder resist layer 270. The electronic component (not shown) may be arranged in the cavity 271.

The solder resist layer 270 is formed on the other surface of the second insulating layer 240 to protect the third circuit layer 250. The solder resist layer 270 exposes the part where the external component (not shown) is to be electrically connected from the third circuit layer 250.

The solder resist layer 270 prevents the circuit layer from being damaged due to soldering during the soldering process. The solder resist layer 270 may also prevent the oxidation of the circuit layer.

The solder resist layer 270 may be formed of a heat resistant cladding material.

Figure 19:
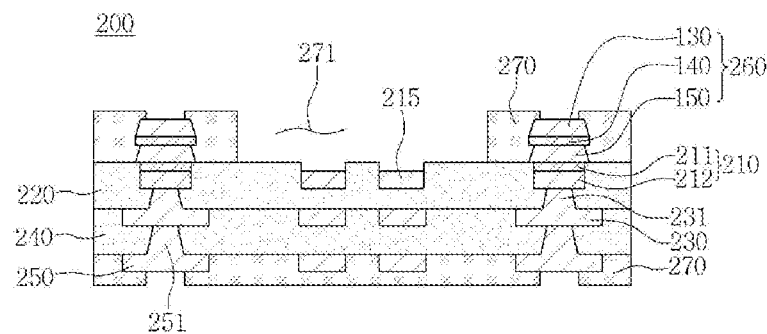

Referring to FIG. 19, the contact pad 215 is formed.

The contact pad 215 is formed by eliminating the circuit barrier layer (211 in FIG. 18) with the etchant that is exposed to the outside by the cavity 271 of the solder resist layer 270. The contact pad 215 may be only the circuit metal layer (212 in FIG. 18) since the circuit barrier layer (211 in FIG. 18) is eliminated.

The contact pad 215 may be electrically connected with an electronic component (not shown) when the electronic component (not shown) is arranged in the cavity 271.

One surface of the contact pad 215 and one surface of the first insulating layer 220 may have a different height due to elimination of the circuit barrier layer (211 in FIG. 18). That is, the contact pad 215 may be formed to have thickness difference compared to the first insulating layer 220. The contact pad 215 may be formed inside the first insulating layer 220 to have the thickness difference which is the thickness of the circuit barrier layer (211 in FIG. 18). A process for forming the solder resist layer may be omitted for soldering around the contact pad 215 due to the thickness difference.

The first circuit layer 210 that is embedded by the solder resist layer 270 and the first insulating layer 220 may have a 2-layered structure. The first circuit layer 210 that is exposed to the outside by the cavity 271 of the solder resist layer 270 may have a single-layered structure.

FIGS. 20 to 23 illustrate additional examples of methods of forming a metal post.

Metal posts 261, 262, 263 according to the additional examples may be structured such that surfaces on one side of first metal posts 131, 132, 133 and surfaces on one side of second metal posts 151, 152, 153 have a smaller diameter than surfaces on the other side.

Figure 20:
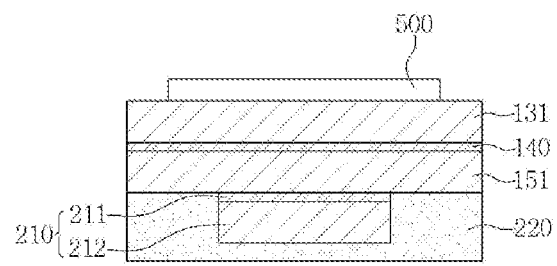
FIGS. 20 to 23 are cross-sectional views illustrating an example of a method of forming a metal post.

Referring to FIG. 20, the first post metal layer 131, the second post metal layer 151 and the post barrier layer 140 are formed to form the metal post (not shown). The first post metal layer 131 may be formed on one surface of the post barrier layer 140 and the second post metal layer 151 may be formed on the other surface of the post barrier layer 140.

The thickness of the second post metal layer 151 may be formed to be the same as that of the first post metal layer 131. In this example, the same thickness refers to substantially the same thickness with consideration of errors and deviations that may occur during the manufacturing process. The etching resist 500 may be formed on one surface of the first post metal layer 131.

Figure 21:
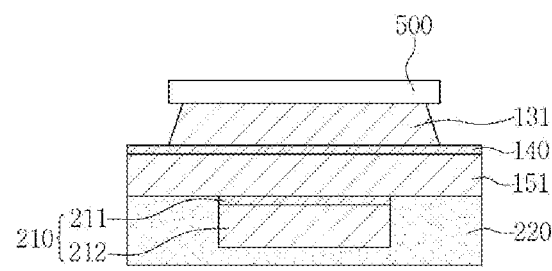

Referring to FIG. 21, the first post metal layer 131 is etched. A process of etching the first post metal layer 131 may be performed by utilizing the process of etching the second post metal layer (150 in FIG. 14).

The first post metal layer 131 may be isotropic etched so that one surface of the first post metal layer 131 is formed to have a smaller diameter than the other surface, while the other surface of the first post metal layer 131 has the same diameter as the etching resist 500.

Figure 22:
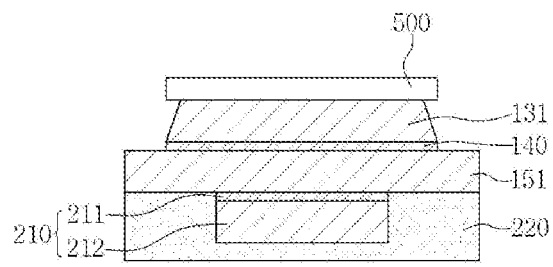

Referring to FIG. 22, the post barrier layer 140 is etched. A process of etching the post barrier layer 140 may be performed by utilizing the process of etching post barrier layer (140 in FIG. 15).

The patterned post barrier layer 140 may have the same diameter as the etching resist 500.

Figure 23:
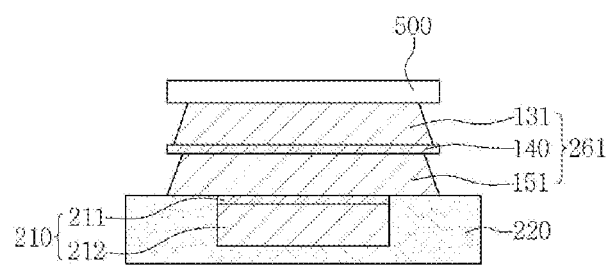

Referring to FIG. 23, the second post metal layer 151 is etched. A process of etching the second post metal layer 151 may be performed by utilizing the process of etching first post metal layer (130 in FIG. 16).

The patterned second post metal layer 151 may be isotropic etched so that one surface of the second post metal layer 151 is formed to have a smaller diameter than the other surface. One surface of the second post metal layer 151 may be formed to have a smaller diameter than the other surface of the post barrier layer 140 to expose the other surface of the post barrier layer 140. The other surface of the second post metal layer 151 may have the same diameter as the etching resist 500.

When the second post metal layer 151 is etched, the first post metal layer 131 which is exposed to the outside may be also etched. Thus, the second post metal layer 151 and the first post metal layer 131 which is exposed to the outside may be etched at the same time.

Since the second post metal layer 151 and the first post metal layer 131 have the same thickness, the second post metal layer 151 and the first post metal layer 131 may have the same etching time.

Since the first post metal layer 131 is also etched, the diameter of the first post metal layer 131 may be reduced so that one surface of the post barrier layer 140 may be exposed to the outside.

As such, the metal post 261 according to the first example is formed from FIGS. 20 to 23.

FIGS. 24 to 27 illustrate examples of methods of forming a metal post.

Figure 24:
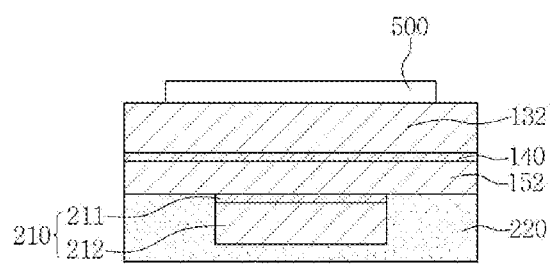
FIGS. 24 to 27 are cross-sectional views illustrating another example of a method of forming a metal post.

Referring to FIG. 24, a first post metal layer 132, a second post metal layer 152 and a post barrier layer 140 are provided to form a metal post (not shown). The first post metal layer 132 is formed on one surface of the post barrier layer 140, and the second post metal layer 152 is formed on the other surface.

The second post metal layer 152 may have a smaller thickness than the first post metal layer 132.

An etching resist 500 is formed on one surface of the first post metal layer 132.

Figure 25:
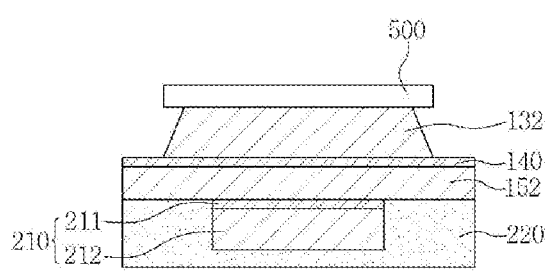

Referring to FIG. 25, the first post metal layer 132 is etched. A process of etching the first post metal layer 132 may be performed by utilizing the process of etching the second post metal layer (150 in FIG. 14).

The first post metal layer 132 may be isotropic etched so that one surface of the first post metal layer 132 is formed to have a smaller diameter than the other surface, while the other surface of the first post metal layer 132 has the same diameter as the etching resist 500. In this example, the same diameter refers to substantially the same diameter with consideration of errors and deviations that may occur during the manufacturing process.

Figure 26:
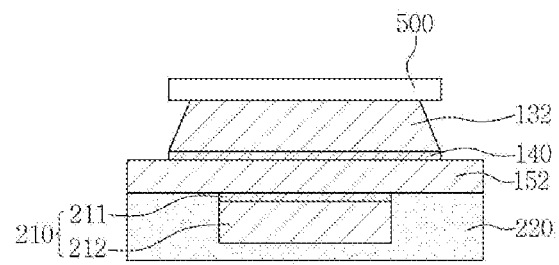

Referring to FIG. 26, the post barrier layer 140 is etched. A process of etching the post barrier layer 140 may be performed by utilizing the process of etching post barrier layer (140 in FIG. 15).

The patterned post barrier layer 140 may have the same diameter as the etching resist 500.

Figure 27:
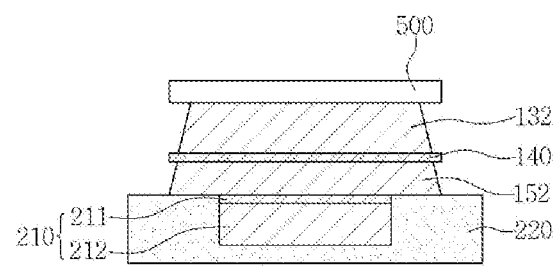

Referring to FIG. 27, the second post metal layer 152 is etched. A process of etching the second post metal layer 152 is performed by utilizing the process of etching first post metal layer (130 in FIG. 16).

The patterned second post metal layer 152 may be isotropic etched so that one surface of the second post metal layer 152 is formed to have a smaller diameter than the other surface. One surface of the second post metal layer 152 may be formed to have a smaller diameter than the other surface of the post barrier layer 140 to expose the other surface of the post barrier layer 140. The other surface of the second post metal layer 152 may have the same diameter as the etching resist 500.

When the second post metal layer 152 is etched, the first post metal layer 132 that is exposed to the outside may be also etched. Thus, the second post metal layer 152 and the first post metal layer 132 that is exposed to the outside may be etched at the same time.

Since the second post metal layer 152 has a thinner thickness than the first post metal layer 132, the etching time of the second post metal layer 152 may be shorter than that of the first post metal layer 132. Thus, the etched amount of the first post metal layer 132 may be less than that of the first post metal layer 131.

The first post metal layer 132 may be etched so that the diameter of the first post metal layer 132 may be also reduced to expose one surface of the post barrier layer 140 to the outside.

As such, the metal post 262 according to the second example is formed from FIGS. 24 to 27.

FIGS. 28 to 31 are cross-sectional views illustrating a method of forming a metal post according to another example.

Figure 28:
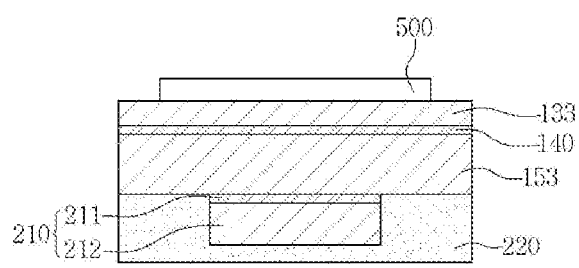
FIGS. 28 to 31 are cross-sectional views illustrating another example of a method of forming a metal post.

Referring to FIG. 28, a first post metal layer 133, a second post metal layer 153 and a post barrier layer 140 form a metal post (not shown). The first post metal layer 133 is formed on one surface of the post barrier layer 140 and the second post metal layer 153 is formed on the other surface.

The second post metal layer 153 is formed to have a thicker thickness than the first post metal layer 133.

An etching resist 500 is formed on one surface of the first post metal layer 133.

Figure 29:
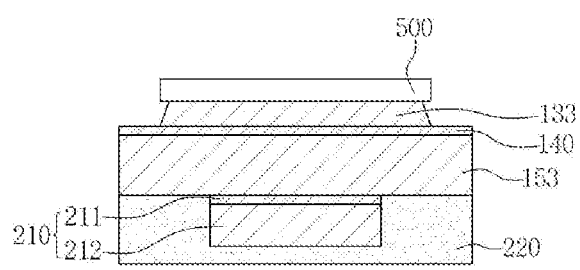

Referring to FIG. 29, the first post metal layer 133 is etched. A process of etching the first post metal layer 133 is performed by utilizing the process of etching the second post metal layer (150 in FIG. 14).

The first post metal layer 133 may be isotropic etched so that one surface of the first post metal layer 133 is formed to have a smaller diameter than the other surface, while the other surface of the first post metal layer 133 has the same diameter as the etching resist 500. In this example, the same diameter refers to substantially the same diameter with consideration of errors and deviations which can be occurred during the manufacturing process.

Figure 30:
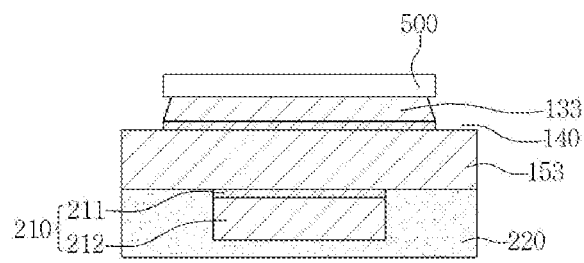

Referring to FIG. 30, the post barrier layer 140 is etched. A process of etching the post barrier layer 140 may be performed by utilizing the process of etching post barrier layer (140 in FIG. 15).

The patterned post barrier layer 140 may have the same diameter as the etching resist 500.

Figure 31:
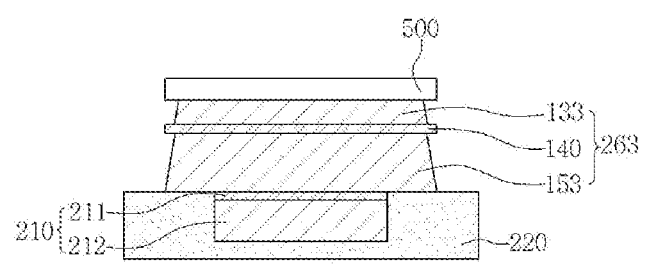

Referring to FIG. 31, the second post metal layer 153 is etched. A process of etching the second post metal layer 153 may be performed by utilizing the process of etching first post metal layer (130 in FIG. 16).

The patterned second post metal layer 153 may be isotropic etched so that one surface of the second post metal layer 153 is formed to have a smaller diameter than the other surface. As illustrated, one surface of the second post metal layer 153 may be formed to have a smaller diameter than the other surface of the post barrier layer 140 to expose the other surface of the post barrier layer 140. The other surface of the second post metal layer 152 may have the same diameter as the etching resist 500.

When the second post metal layer 153 is etched, the first post metal layer 133 that is exposed to the outside may be also etched. Thus, the second post metal layer 153 and the first post metal layer 133 that is exposed to the outside may be etched at the same time.

Since the second post metal layer 153 has a thicker thickness than the first post metal layer 133, the etching time of the second post metal layer 153 may be longer than that of the first post metal layer 133. Thus, the etched amount of the first post metal layer 133 may be more than that of the first post metal layer 131.

The first post metal layer 133 may be etched so that the diameter of the first post metal layer 133 may be also reduced to expose one surface of the post barrier layer 140 to the outside.

According to the first to the third examples, various types of metal posts (260 in FIG. 2) may be formed. Various types of metal posts (260 in FIG. 2) may be formed by controlling the thickness of the first post metal layer (130 in FIG. 1) and the second post metal layer (150 in FIG. 1) of the carrier board (100 in FIG. 1) and/or 2 etching processes.

As such, the metal post 263 according to the first example is formed from FIGS. 28 to 31.

According to the above examples, a printed circuit board including more than one metal post with a constant thickness may be obtained.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
   an insulating layer;
   a circuit layer embedded in the insulating layer;
   a solder resist layer disposed on one surface of the insulating layer, the solder resist layer having a cavity of a through-hole shape to expose a part of the circuit layer from the insulating layer; and
   a metal post embedded in the solder resist layer and exposed to outside via an opening of the solder resist layer,
   wherein the metal post comprises a first post metal layer, a post barrier layer, and a second post metal layer disposed in that order, and
   wherein the post barrier layer is formed of a material that is different from that of the first post metal layer and the second post metal layer.

2. The printed circuit board of claim 1, wherein the post barrier layer comprises a material that has a different reactivity to an etchant reactive to the first post metal layer and second post metal layer.

3. The printed circuit board of claim 1, wherein the circuit layer has a 2-layered structure comprising a circuit metal layer and a circuit barrier layer, the circuit barrier layer disposed on the circuit metal layer.

4. The printed circuit board of claim 3, wherein a portion of the circuit layer that is exposed to the outside through the cavity is formed in a single-layered structure comprising a circuit metal layer.

5. The printed circuit board of claim 4, wherein a thickness of the circuit layer exposed to outside through the cavity is different from a thickness of the insulating layer, and a thickness of the circuit barrier layer is substantially equal to a difference in the thickness of the circuit layer and the thickness of the insulating layer.

6. The printed circuit board of claim 1, wherein a first surface of the first post metal layer has a smaller diameter than a second surface of the first post metal layer, and a first surface of the second post metal layer has a smaller diameter than a second surface of the second post metal layer.

7. The printed circuit board of claim 6, wherein the solder resist layer is disposed on an other side of the insulating layer to cover the circuit layer.

8. A method of manufacturing a printed circuit board, the method comprising:
   preparing a carrier board comprising:
      a carrier inner layer, and
      an adhering layer, a first post metal layer, a post barrier layer, and a second post metal layer disposed on the carrier inner layer in that order; forming a circuit barrier layer on the second post metal layer;
   forming a build-up layer comprising an insulating layer and a circuit layer embedded in the insulating layer on the circuit barrier layer;
   eliminating the carrier inner layer and the adhering layer;
   forming a metal post by patterning the first post metal layer, the post barrier layer and the second post metal layer; and
   forming a solder resist layer on the insulating layer to embed the metal post in the solder resist layer and expose the metal post to the outside via an opening in the solder resist layer,
   wherein the post barrier layer is formed of a material that is different from that of the first post metal layer and the second post metal layer.

9. The method of claim 8, wherein the post barrier layer is formed of a material that has a different reactivity to an etchant reactive to the first post metal layer and second post metal layer.

10. The method of claim 8, wherein the forming of the circuit barrier layer comprises forming the circuit barrier layer from a material that is different from that used for the circuit layer and the second post metal layer.

11. The method of claim 10, wherein the circuit barrier layer is formed of a material that has a different reactivity to an etchant reactive to the circuit layer and the second post metal layer.

12. The method of claim 8, wherein the forming of the metal post comprises:
   forming an etching resist on the other surface of the first post metal layer to cover the upper part of the region to be included in the metal post;
   etching the first post metal layer exposed to the outside with a first etchant;
   etching the post barrier layer exposed to the outside by the etching of the first post metal layer with a second etchant;
   etching the second post metal layer exposed to the outside by the etching of the post barrier layer with the first etchant; and
   eliminating the etching resist,
   wherein the first post metal layer and the second post metal layer are not reactive to the second etchant, and the post barrier layer is not reactive to the first etchant.

13. The method of claim 8, wherein the forming of the solder resist layer comprises forming a cavity with a through-hole shape in the solder resist layer.

14. The method of claim 13, further comprising eliminating the circuit barrier layer exposed to the outside through the cavity formed in the solder resist after forming the solder resist layer.

15. A method of manufacturing a printed circuit board, the method comprising:
   obtaining a carrier board comprising a first post metal layer, a post barrier layer, a second post metal layer and a carrier inner layer;
   forming a build-up layer on the carrier board, the build-up layer comprising an insulating layer and a circuit layer embedded in the insulating layer;
   removing a portion of the carrier board comprising the carrier inner layer;
   forming a metal post by patterning the first post metal layer, the post barrier layer and the second post metal layer; and
   forming a solder resist layer on the insulating layer to embed the metal post in the solder resist layer and expose the metal post to the outside via an opening in the solder resist layer,
   wherein the post barrier layer is formed of a material that is different from that of the first post metal layer and the second post metal layer.

16. The method of claim 15, wherein the forming of the metal post comprises etching the first post metal layer using a first etchant, and etching the post barrier layer using a second etchant different from the first etchant.

* * * * *